United States Patent
Schäfer

(10) Patent No.: US 6,794,860 B2
(45) Date of Patent: Sep. 21, 2004

(54) TRANSFORMER FOR A CURRENT SENSOR

(75) Inventor: Stefan Schäfer, Rummelsheim (DE)

(73) Assignee: Vacuumschmelze GmbH & Co. KG (DE)

( * ) Notice: Subject to any disclaimer, the term of this patent is extended or adjusted under 35 U.S.C. 154(b) by 0 days.

(21) Appl. No.: 10/469,122

(22) PCT Filed: Feb. 28, 2002

(86) PCT No.: PCT/EP02/02191
§ 371 (c)(1),
(2), (4) Date: Jan. 30, 2004

(87) PCT Pub. No.: WO02/071081
PCT Pub. Date: Sep. 12, 2002

(65) Prior Publication Data
US 2004/0140879 A1 Jul. 22, 2004

(30) Foreign Application Priority Data
Mar. 5, 2001 (DE) .......................... 101 10 475

(51) Int. Cl.⁷ ............................................... H01F 17/06
(52) U.S. Cl. .................... 324/117 H; 324/127; 336/175
(58) Field of Search ............................ 324/239, 117 H, 324/127; 323/356–358; 336/175

(56) References Cited

U.S. PATENT DOCUMENTS

| 3,534,247 | A |   | 10/1970 | Miljanic |
| 5,307,008 | A |   | 4/1994  | So |
| 5,532,591 | A | * | 7/1996  | Logue .......................... 324/242 |
| 6,191,673 | B1 |  | 2/2001  | Ogura et al. |
| 6,265,871 | B1 | * | 7/2001  | Logue et al. ................ 324/240 |
| 6,271,664 | B1 | * | 8/2001  | Logue ......................... 324/240 |
| 6,580,267 | B2 | * | 6/2003  | Logue et al. ................ 324/240 |

FOREIGN PATENT DOCUMENTS

| DE | 19706127 | 8/1998 |
| EP | 0294590  | 12/1988 |
| EP | 0538578  | 4/1993 |
| EP | 0838686  | 4/1998 |

OTHER PUBLICATIONS

J. West and P. Miljanic, "An Improved Two–Stage Current Transformer," IEEE Transactions on Instrumentation and Measurement, vol. 40, No. 3, Jun. 1991, pp. 633–635/.

* cited by examiner

Primary Examiner—Anh Mai
(74) Attorney, Agent, or Firm—Dean W. Russell; Kilpatrick Stockton LLP

(57) ABSTRACT

The invention relates to a transformer comprising a closed probe core (2) consisting of a soft magnetic material, a probe coil (3), at least part of which is wound around the probe core (2), a closed compensation core (1) consisting of soft magnetic material, and a compensation coil (4), at least part of which is wound around the probe core (2) and the compensation core (4). The probe core (2) and the compensation core (4) are arranged in relation to one another in such a way that a conductor (5), which carries a measuring current, can be guided through the probe core (2) and the compensation core (1).

9 Claims, 2 Drawing Sheets

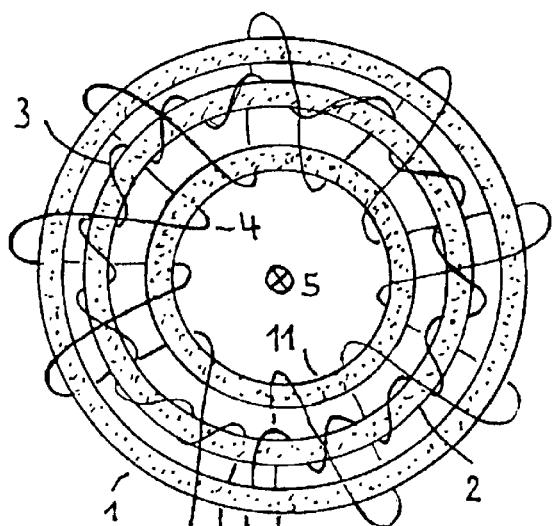
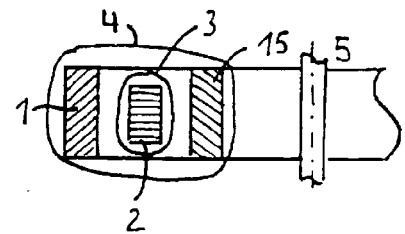
FIG 4
FIG 3
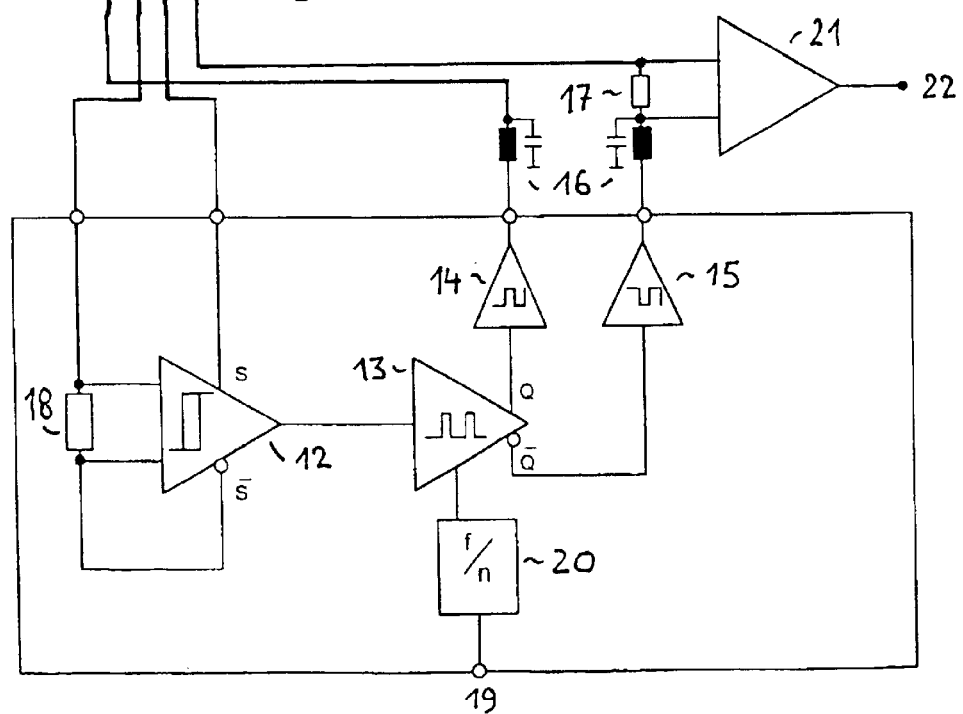

TRANSFORMER FOR A CURRENT SENSOR

CROSS REFERENCE TO RELATED APPLICATIONS

This application is the U.S. national phase of International Application No. PCT/EP02/02191 filed on Feb. 28, 2002 Jan. 30, 2002 published as International Publication No. WO 02/071081 A1 on Sep. 12, 2002, which claims priority to German Patent Application No. 101 10 475.8 filed on Mar. 5, 2001, the contents of which are incorporated by reference.

BACKGROUND OF THE INVENTION

This invention relates to a transformer for a current sensor.

The transformer here is to be understood as a magnetic configuration in the general sense, which is magnetically coupled to a primary conductor and electrically coupled to an electronic analyzer. This forms a current sensor, which makes it possible to determine the current in the primary conductor, both AC and DC current detection being equally possible.

For example, so-called compensation current sensors are known; they have a toroidal magnetic core with an air gap. The magnetic core is provided with a secondary winding (compensation winding). The primary conductor, i.e.; the conductor carrying the current to be measured, passes centrally through the magnetic core. A magnetic field probe which detects the flux in the magnetic core is situated in the air gap of the core. The probe signal is sent via an amplifier circuit to the secondary winding (compensation winding) such that the magnetic flux induced by the primary conductor is constantly being compensated to zero. The secondary current required for this is then strictly proportional to the primary current to be measured. Based on a linear primary conductor, the proportionality factor is determined based on the number of windings of the secondary winding (compensation winding). A probe that operates according to the Hall principle, in particular a corresponding integrated circuit, is often used as the magnetic field sensor. In the case of such a Hall probe, the air gap is absolutely essential because the magnetic field sensitivity is relatively low. The field concentration due to the magnetic core is thus necessary to ensure a sufficiently high sensitivity of the control circuit.

Use of a Hall probe has the disadvantage of a definite offset, which means that without the applied magnetic field, the output voltage is different from zero. Furthermore, this offset has a marked temperature dependence, which results in a definite offset having a marked temperature dependence [sic].

In addition, compensation current sensors having a field probe made of a soft magnetic material are known, such as those described in European Patent Application 0 294 590 A2, for example. A closed magnetic core is used in this embodiment. In addition to the magnetic core, at least one strip-shaped element made of an amorphous soft magnetic material equipped with an indicator winding is arranged next to the magnetic core. This element then functions as the magnetic field probe. For analysis, a pulse-shaped bipolar magnetization is induced with the help of an indicator winding, and the asymmetry of the current and/or voltage amplitudes is used to determine and analyze the mismatch. This arrangement has the advantage over the configuration using the Hall probe that the hysteresis of this probe is negligible. In the case of a compensation current sensor, this results in a very small offset. In addition, the temperature drift of such a probe is negligible in most cases, so the offset is also thermally stable.

However, the arrangement mentioned last has the disadvantage that the magnetic field probe detects the field of the primary conductor, i.e.; the field in the atmosphere. There is no concentration of flux due to the magnetic core. Since the magnetic field probe is a strip-shaped element, the effective permeability of the magnetic core of the probe is relatively low due to the strong shearing of the magnetic circuit. On the whole, this results in a moderate sensitivity of the magnetic field probe. However, a low sensitivity of the magnetic field probe results in a low magnification in the first step of the control circuit, so that an offset of the participating amplifiers is manifested as an offset of the entire current sensor.

To avoid this disadvantage, an air gap is introduced into the magnetic core in European Patent Application 0 294 590 A2. This air gap ensures a concentration of flux at the probe location and thus results in a greater sensitivity of the entire arrangement. This eliminates the first disadvantage of the arrangement.

However, a second disadvantage of this arrangement involves a certain external field sensitivity. The magnetic field probe(s) can also detect external magnetic fields just like the field of the primary conductor and that of the compensation coil. When using two magnetic field probes, an external field is compensated because the probes are oppositely polarized. However, this is true only in a completely homogeneous external magnetic field, but in reality such a magnetic field exists only in extremely rare cases, because external magnetic fields emanate from adjacent current conductors or transformers, for example, which emit a strongly heterogeneous magnetic field.

A third disadvantage of the configuration disclosed in European Patent Application 0 294 590 A2 is the dependence on the position of the primary conductor. This configuration has a high precision only when an idealized, infinitely long conductor passes through the magnetic core exactly on its axis. Only then are the probes flooded by the magnetic core precisely so as to yield a strict proportionality between the secondary current and the primary current. For example, if the primary conductor is passed as a loop over a ring segment of the magnetic core, a very high flux is fed into the magnetic core at this location, while the H field at the site of the probes is definitely lower than in the axial bushing of the primary conductor. Although the sensor will still supply an output signal having a linear current in this case, its slope is much lower than in the optimum design, and its measurement range also turns out to be much lower because of saturation effects in the magnetic core.

These disadvantages are compensated by additional measures described in the related art. These measures include the special winding of the sensor strip (as described in European Patent 0 538 578), the special shape of the stacked magnetic core (as disclosed in European Patent 0 510 376), the use of a bending core (as disclosed in German Patent 197 20 010.9) and a tight coupling between the primary side and the secondary side (corresponding to German Patent 197 05 770.8, for example).

Based on the configuration described in European Patent Application EP 0 294 590 A2, only a single magnetic field probe is assumed for the following discussion. The air gap is retained to ensure an adequate sensitivity of the magnetic field probe. However, the magnetic field probe is introduced into the air gap of the magnetic core and/or into a pocket of the magnetic core. This greatly reduces the external field sensitivity because the magnetic core has a shielding effect.

In addition, this avoids a dependence on the position of the primary conductor because any flux fed into the magnetic core by the primary conductor must penetrate through the magnetic field probe. These state-of-the-art current sensors, which can we manufactured inexpensively, are thus characterized by the following properties:

1. They have a much smaller offset than comparable current sensors using Hall magnetic field probes because the magnetic probe does not have any hysteresis.
2. They have a lower external field sensitivity.
3. They have only a very low dependence on the position of the primary conductor.
4. The sensor can be manufactured very inexpensively because the magnetic core consists of two punched blanks/bent parts and the compensation coil consists of a simple spool winding.

On the other hand, however, disadvantages are associated with such embodiments. For example, the magnetic field probe sits in the air gap of the magnetic core and is thus influenced by the remanence of the magnetic core. Magnetic cores made of nickel/iron material that can be manufactured inexpensively have a certain coercitive field strength, which results in a remanent magnetic flux even without any external control. The ends of the magnetic core in the air gap act like pole faces, i.e.; even without control here there is a certain field which influences the magnetic field probe. This results in an offset of the current sensor. This offset is much smaller than that with current sensors using Hall magnetic field probes, but in certain applications it may still be manifested as interference. With respect to the primary current, it is approximately of the order of magnitude of 50 to 100 mA. Such an offset means a lower limit to the measurement range because currents on the order of magnitude of the offset can no longer be detected accurately.

Another disadvantage of the known arrangement is derived from the fact that the secondary coil is applied to only one sector of the magnetic core in the area of the magnetic field probe. The magnetic flux of the secondary coil is not closed exclusively via the magnetic core but instead also as stray flux in space. This stray flux is missing in the areas of the magnetic core outside of the compensation coil for compensation of the flux induced by the primary conductor. Outside of the compensation coil, the magnetic core is therefore triggered in proportion to the intensity of the primary current. Beyond a certain primary current, the saturation flux density of the magnetic core is reached and the magnetic core is partially saturated. Beyond this point, the current sensor is highly nonlinear, i.e.; this effect forms the upper limit of the measurement range of the current sensor.

SUMMARY OF THE INVENTION

Therefore, the object of this invention is to provide a current sensor which will avoid the saturation problems described above while also having an extremely small offset.

This object is achieved by a transformer according to Patent Claim 1. Embodiments and refinements of the idea of this invention are the object of the subclaims.

Transformers according to this invention are characterized by a very large measurement range, but current sensors designed with them are nevertheless compact and are simple and easy to manufacture from the standpoint of their structural embodiment. In particular, they have a smaller offset than comparable current sensors using Hall magnetic field probes, because the magnetic field probe does not have any hysteresis. They also have a lower external field sensitivity and have only a low dependence on the position of the primary conductor. Finally, this current sensor can be manufactured very inexpensively because the magnetic core may consist of two punched blanks/bending parts and the compensation coil may consist of a simple spool winding.

This is achieved in particular by a transformer having a closed probe core made of a soft magnetic material, a probe winding, which is wound around the probe core in at least some sections, a closed compensation core made of a soft magnetic material and a compensation winding which is wound around the probe core and the compensation core in at least some sections, the probe core and the compensation core being arranged relative to one another such that a conductor carrying the current to be measured can be passed through the probe core and the compensation core. The probe winding and/or the compensation winding may be wound only in part or preferably completely around the complete extent of the core. Due to the complete winding, a symmetrical distribution of the magnetic field with a low leakage field is achieved.

In addition, an amorphous metal, i.e.; a nanocrystalline metal, may be used as the soft magnetic material, preferably in the case of the probe core but also in the case of the compensation core or both.

The probe core and the compensation core are preferably designed as (round) ring cores, the probe core and the compensation core being arranged concentrically relative to one another. In addition, it is possible to provide for the probe core to have a considerably smaller cross-sectional area than the compensation core.

In a refinement of this invention another closed compensation core is provided, the probe winding being wound in at least some sections only around the probe core and the compensation winding being wound in at least some sections around the probe core and both compensation cores. The probe core is preferably situated between the two compensation cores. In this way, optimum shielding of the compensation core and the compensation winding and thus extensive shielding from interference fields are achieved.

DESCRIPTION OF THE DRAWING

This invention is explained in greater detail below on the basis of the exemplary embodiments shown in the figures of the drawing, which show:

FIG. 3 a second embodiment of a transformer according to this invention having two compensation cores in combination with a special embodiment of a current sensor; and FIG. 4 the transformer according to FIG. 3 in cross section.

DESCRIPTION OF PREFERRED EMBODIMENTS

Figure 1:
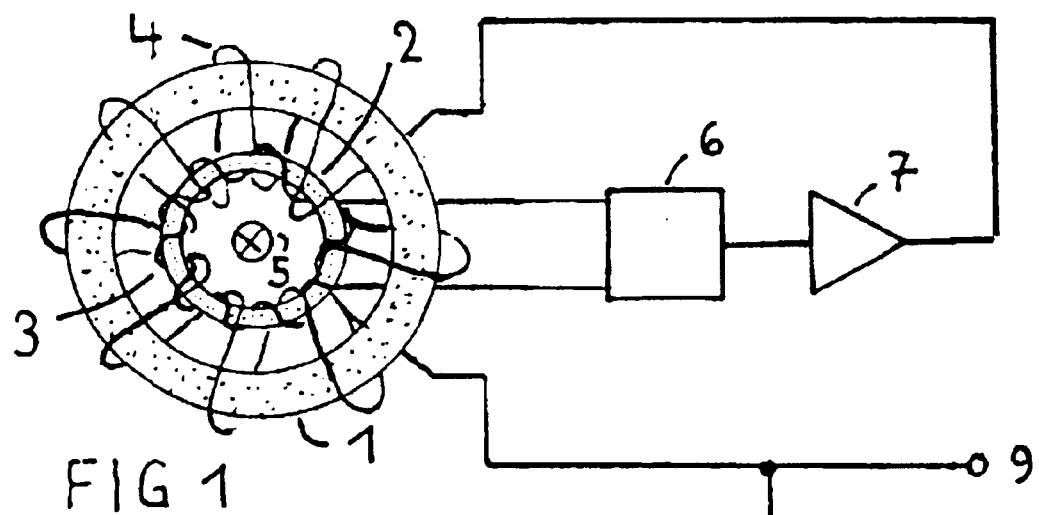
FIG. 1 a first exemplary embodiment of a transformer according to this invention having a compensation core in an application in a general embodiment of a current sensor.

In the application shown in FIG. 1, an inventive transformer is provided with a closed condensation core 1 and a closed probe core 2. Although both cores may have any closed shape (square, rectangular, oval, etc.), the toroidal shape (ring or circular shape) has been preferred because it is the simplest to manufacture and has the best properties in this regard. The probe core here has a smaller diameter than the compensation core and consequently is situated in the interior of the compensation core 1. It would equally be possible to place the probe core in the exterior space of the compensation core or above the compensation core, but the arrangement in the interior is more favorable with regard to the shielding from external interference fields on the probe core 2.

A probe winding 3 is wound around the probe core 2 over the entire circumference of the probe core 2. The complete winding of the probe core 2 has the advantage than the sensitivity of the arrangement of the probe core 2 and the probe winding 3 is independent of position. In addition, a compensation winding 4 which is provided is also wound around the entire circumference of the compensation core 1 and the probe core 2 for the same reasons. Finally, a conductor 5 carrying the current that is to be measured is situated in the interior of the probe core 2 and thus also in the interior of the compensation core 1. Due to the closed design of the probe core and the compensation core and in particular the special arrangement of the two, this yields the result that the measured field and thus the measured current are independent of the position of the conductor 5 in the interior of the probe core 2 and the compensation core 1.

The following analyzer circuit, which is shown only schematically in FIG. 1 as an exemplary embodiment, consists of a symmetry stage 6 and an amplifier stage 7 downstream from the former. The symmetry stage 6 is connected at the input side to the probe winding 3. Bipolar magnetization is induced in the probe core 2 via the symmetry stage 6. In this stage, an output signal generated from the asymmetry of the voltage and/or current characteristics over time is amplified in the amplifier stage 7 and is used for controlling the compensation winding 4.

The output current of the amplifier stage 7 is fed into the compensation coil across a resistor 8 (e.g., leading to ground potential 10). In the regulated state, the field of this current in the compensation core 1 and in the probe core 2 compensates for the magnetic flux of the primary conductor 5. Then the output current of the amplifier stage 7 and thus the voltage drop across the resistor 8 are proportional to the primary current flowing in the primary conductor 5.

Figure 2:
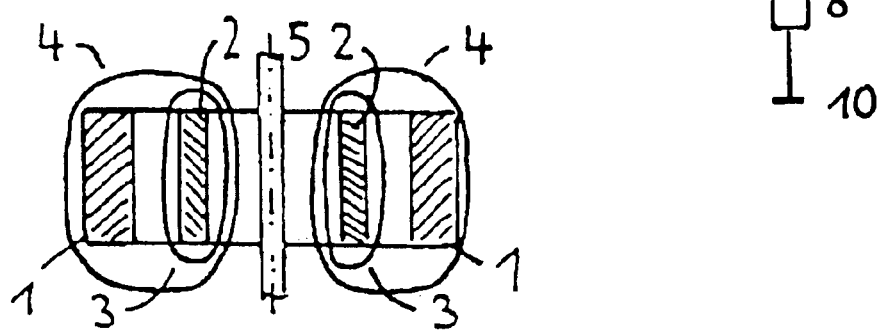
FIG. 2 the transformer according to FIG. 1 in cross section.

FIG. 2 shows the design of the inventive transformer according to FIG. 1 in cross section. It can be seen here that the compensation core 1 and the probe core 2 have different cross sections. A part of the probe winding 3 is accommodated in the interspace between the compensation core 1 and the probe core 2. Finally, the compensation winding 4 is wound around the compensation core 1, the probe core 2 and the probe winding 3.

Another embodiment of the inventive transformer in combination with an analyzer circuit shown in detail is shown in FIG. 3. In comparison with the exemplary embodiment according to FIG. 1 the transformer according to FIG. 3 has been expanded to the extent that an additional compensation core 11 is arranged in the interior of the probe core 2 and thus in the interior of the compensation core 1. The additional compensation core 11 is placed between the probe core 2 and the conductor 5. While the probe winding 2 remains unchanged in comparison with the exemplary embodiment according to FIG. 1, the compensation winding 4 is wound around the probe core 2, the probe winding 3 and the two compensation cores 1 and 11.

The following analyzer circuit consists of a symmetry stage 12 and a downstream pulse width amplifier 13. The symmetry stage 12 is connected at the input to the probe winding 3. The probe core 2 is subjected to bipolar magnetization via the symmetry stage 12. In accordance with the asymmetry between the current and/or voltage characteristics over time, an output signal is generated in this stage, controlling the downstream pulse width amplifier 13 whose symmetrical output signal is used to trigger the compensation winding 4 with the intermediate connection of two driver stages 14, 15, a (symmetrical) filter stage 16 and a resistor 17. In the regulated state, the field of this current in the compensation core 1 and in the probe core 2 again compensates for the magnetic flux of the primary conductor 5. Then the output current generated by the pulse width amplifier 13 and thus the voltage drop across the resistor 17 are proportional to the primary current flowing in the primary conductor 5.

The symmetry stage 12 may have, for example, a Schmitt trigger having a symmetrical input and a symmetrical output, the output being provided for controlling the probe winding 3. The voltage applied from the output of the Schmitt trigger to the probe winding 3 generates in the probe winding 3 a current which is also influenced by the additional flux in the probe core 2 generated by the compensation winding 4 and the primary conductor 5. The current is in turn detected at the input of the Schmitt trigger by means of a resistor 18. A pulse width modulated signal at the output of the symmetry stage 12 then indicates the asymmetry between the input signal and the output signal at the Schmitt trigger and thus reflects the asymmetry between the current and voltage on the probe winding 3. This pulse width signal is then processed by the pulse width amplifier 13. The pulse width amplifier 13 is therefore cycled by an external clock signal source 19 via a frequency divider 20.

Finally the voltage across the resistor 17, which is proportional to the current flowing in the primary conductor 5, is picked up by a differential amplifier 21 and is then available as output voltage 22 (or output current).

In the exemplary embodiment according to FIG. 1, nanocrystalline material is provided as the core material for probe core 2, but in the exemplary embodiment according to FIG. 2 amorphous metal is used (or vice versa). However NiFe material is used as the core material for the compensation core 4 in both cases.

FIG. 4 shows the cross section of a part of the transformer according to FIG. 3. The two compensation cores 1 and 11 here flank the probe core 2 on both sides in the radial direction of the three cores. The cross-sectional area of the probe core 2 here is smaller than the cross-sectional area of each of the two compensation cores 1, 11 which have the same cross-sectional area in this exemplary embodiment. In addition, the height of the probe core 2 is lower than the height of two compensation cores 1, 11.

The probe winding 3 is arranged in such a way that it reaches at the maximum the height of the two compensation cores 1 and 11. Finally the compensation winding 4 is wound around the compensation cores 1, 11, the probe core 2 and the probe winding 3. Since the second cross section is identical to the first, only half has been shown in the drawing of the transformers.

Thus in the exemplary embodiments shown here, a closed preferably ring-shaped magnetic core of amorphous or nanocrystalline metal is used as the magnetic field probe. The annular core is provided with a winding, which surrounds the entire core, preferably symmetrically. With the help of this winding, the magnetic core is magnetized in a bipolar manner either periodically or in pulses and the asymmetry of the current and/or voltage amplitudes is used to analyze the compensation.

A second closed magnetic core, preferably in the form of a ring, is arranged concentrically with the probe core in the plane of the probe core. The two cores as well as the winding of the probe core are enclosed by the secondary winding. The primary conductor is passed through the openings in the two cores. A current is fed into the compensation winding by the analyzer circuit, compensating the magnetic flux of the primary conductor in both cores at all times. The compensation current is thus proportional to the primary current.

In an arrangement like that shown in FIG. 1 or 3, for example, a primary current may also be measured even without generating a compensation current across the compensation winding. In the case of a small primary current, a proportional approximately offset-free output signal is obtained with a suitably designed symmetry stage if the driver stage(s) (amplifier stage) is/are switched to a high resistance via a control signal. The current sensor thus offers the possibility of switching current measurement ranges.

At a small current, it is under some circumstances possible to perform a very precise measurement with the output signal of this stage by means of a great linear amplification of the symmetry stage. If the primary current exceeds a fixed threshold, the amplifier stage (e.g., 7) may be switched on. The sensor then measures as the compensation current sensor very great primary currents. Such a current sensor has an extremely large dynamic range.

What is claimed is:

1. A transformer for a current sensor comprising
    a closed probe core made of a soft magnetic material,
    a probe winding wound around the probe core in at least some sections,
    a closed compensation core of a soft magnetic material,
    a compensation winding which is wound around the probe core and the compensation core in at least some sections, whereby
    the probe core and the compensation core are arranged relative to one another such that
    a conductor carrying the current to be measured can be passed through the probe core and the compensation core.

2. The transformer according to claim 1, wherein the probe winding is wound uniformly over the entire circumference of the probe core.

3. The transformer according to claim 1, wherein the compensation winding is wound uniformly around the probe core and the compensation core over the entire circumference.

4. The transformer according to claim 1, wherein amorphous metal is provided as the soft magnetic material of the probe core.

5. The transformer according to claim 1, wherein nanocrystalline metal is provided as the soft magnetic material of the probe core.

6. The transformer according to claim 1, wherein the probe core and the compensation core are designed as ring cores, and the probe core and the compensation core are arranged so they are concentric with one another.

7. The transformer according to claim 1, wherein the probe core has a smaller cross-sectional area than the compensation core.

8. The transformer according to claim 1, wherein another closed compensation core is provided, the probe winding being wound around the probe core in at least some sections, and the compensation winding being wound around the probe core and the two compensation cores in at least some sections.

9. The transformer according to claim 8, wherein the probe core is arranged between the two compensation cores.

* * * * *